(12) United States Patent
Takagi et al.

(10) Patent No.: US 6,958,608 B2
(45) Date of Patent: Oct. 25, 2005

(54) NUCLEAR MAGNETIC RESONANCE EQUIPMENT

(75) Inventors: Kazumasa Takagi, London (GB); Kazuo Saitoh, Kodaira (JP); Hisaaki Ochi, Kodaira (JP); Hiroshi Morita, Mito (JP); Masae Kiryu, Hitachi (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/852,254

(22) Filed: May 25, 2004

(65) Prior Publication Data

US 2004/0251902 A1 Dec. 16, 2004

(30) Foreign Application Priority Data

Jun. 10, 2003 (JP) .................... 2003-165099

(51) Int. Cl.[7] .............................. G01V 3/00
(52) U.S. Cl. .................... 324/318; 324/309
(58) Field of Search ................ 324/318, 319, 324/322, 309, 307, 303, 300; 600/410, 420

(56) References Cited

U.S. PATENT DOCUMENTS 5,229,358 A * 7/1993 Kumar .................... 505/434
5,247,256 A     9/1993 Marek
5,585,723 A * 12/1996 Withers .................... 324/318
6,392,156 B1 * 5/2002 Davidson et al. ........ 174/125.1

FOREIGN PATENT DOCUMENTS

| JP | 11-133127 | 8/1998 |
| JP | 2003-255032 | 2/2002 |
| JP | 2003-324012 | 5/2002 |

* cited by examiner

*Primary Examiner*—Brij B. Shrivastav
(74) *Attorney, Agent, or Firm*—Reed Smith LLP; Stanley P. Fisher, Esq.; Juan Carlos A. Marquez, Esq.

(57) ABSTRACT

The invention provides nuclear magnetic resonance equipment realizing improved sensitivity of a probe for receiving a free induction decay (FID) signal in nuclear magnetic resonance (NMR) spectroscopy in a high frequency band of 600 MHz or higher. By manufacturing a solenoid coil of a higher filling factor by using a superconductor of extremely low resistance to high frequency current, sensitivity is increased. A superconducting thin film made of magnesium diboride ($MgB_2$) formed on a donut plate-type substrate is disposed so that the film surface becomes parallel with the uniform magnetic field. The object is realized by a probe made by a solenoid coil formed by connecting a plurality of coil parts by capacitive coupling via a normal metal lead.

16 Claims, 16 Drawing Sheets

NUCLEAR MAGNETIC RESONANCE EQUIPMENT

CLAIM OF PRIORITY

The present application claims priority from Japanese application JP 2003-165099 filed on Jun. 10, 2003, the content of which is hereby incorporated by reference into this application.

FIELD OF THE INVENTION

The present invention relates to nuclear magnetic resonance equipment (hereinbelow, referred to as NMR equipment) and, more particularly, to NMR equipment characterized by the shape of a coil of a probe for transmitting a radio-frequency signal at a predetermined resonance frequency and/or receiving a free induction decay (FID) signal from a sample placed in a uniform magnetic field and by a structure for mounting.

BACKGROUND OF THE INVENTION

NMR equipment capable of applying a radio-frequency signal of high resonance frequency to a sample in uniform high magnetic fields ($B_0$) in order to increase the resolution in nuclear magnetic resonance spectral (NMR spectral) has been developed. To generate high magnetic fields of 10 tesla (T) or higher, a superconducting magnet is generally used. At present, high magnetic field NMR equipment for mainly analyzing the structure of protein is being developed. NMR equipment with magnetic field intensity of 21.6 T and resonance frequency of 920 MHz is produced.

On the other hand, a probe for receiving a free induction decay (FID) signal generated by a sample in response to the applied radio-frequency pulse signal is required to have high sensitivity. In the case of a sample whose amount is small like protein, the intensity of the FID signal is particularly low and it takes long time for measurement. Most noises of the probe occur due to electric resistance of the probe as a component of a resonator and depend on the temperature and surface resistance of a material. To reduce the noises, as disclosed in U.S. Pat. No. 5,247,256, a probe coil and a preamplifier are disposed at a low temperature. In addition, recently, a high-temperature superconductor of which surface resistance is lower than that of a normal metal such as copper by two orders of magnitude or more is used. U.S. Pat. No. 5,585,723 discloses the technique of using a high-temperature superconductor for a probe coil.

A superconducting magnet having excellent uniformity in magnetic field intensity is realized by an integral-type solenoid magnet, and a variation with respect to a sample to be measured is as small as $10^{-9}$. In NMR equipment having such a solenoid magnet, the axial direction of a sample tube for introducing a sample to a magnetic field coincides with the axial direction of the solenoid magnet. A radio-frequency signal is applied perpendicular to the axial direction of the sample tube and the solenoid magnet. Consequently, a saddle coil and a bird-cage antenna are used for the probe. Japanese Unexamined Patent Publication No. Hei 11-133127 discloses the technique using a bird-cage antenna.

In the case of making a saddle or bird-cage coil or antenna of a superconductor, particularly, a high-temperature superconductor in order to reduce noise in the probe coil, a superconducting thin film formed on a flat oxide single-crystal substrate is used, so that a shape cannot be chosen freely and it is difficult to efficiently cover the sample. Therefore, although noise of the coil caused by resistance is reduced, the efficiency of application of the radio-frequency signal is reduced due to decrease in the filling factor related to the shape.

The filling factor of the solenoid coil is higher than that of a saddle coil, a bird-cage coil, or a bird-cage antenna. A technique of making a solenoid coil of an oxide high-temperature superconductor is described in the above-described U.S. Pat. No. 5,585,723. In the known technique, a flat donut-shaped ring (one coil part) is fabricated by a high-temperature superconducting thin film, and a part in the ring is trimmed, thereby forming a capacitor via a substrate. In such a manner, an LC resonator is formed. Since it is difficult to electrically connect coil parts, a solenoid coil cannot be formed by connecting a plurality of flat donut-shaped rings. A radio-frequency signal is applied to a sample by inductive coupling using mutual inductance of the coil parts, and an FID signal from the sample is received. However, in the method of using the mutual inductance of the coil parts, adjustment is difficult and, generally, efficiency is low.

To increase the filling factor and the efficiency of detecting the FID signal, it is sufficient to increase the number of turns of the solenoid coil. To realize it, an NMR probe for radio frequency accompanies difficulties. Specifically, although it is necessary to make the product between the inductance of a coil and the capacitance of a capacitor at a feeding point correspond to the radio-frequency to be applied, it is difficult to set the capacitance of the capacitor at the feeding point to 3 pF porless from the viewpoint of manufacture. Further, in NMR equipment in which a radio-frequency signal used for analysis of the structure of protein is in the class of 600 MHz, it is strongly demanded to reduce the inductance of the coil. Consequently, manufacture becomes more difficult.

SUMMARY OF THE INVENTION

An object of the invention is to provide NMR equipment realizing higher sensitivity of a probe coil receiving a free induction decay (FID) signal in nuclear magnetic resonance (NMR) spectral.

In the invention, to increase the sensitivity of the probe coil, the following means is provided. First, an uniform high magnetic field ($B_0$) is generated by a superconducting magnet-which is divided in halves. Next, a probe coil for applying a radio-frequency signal of a resonance frequency to a region of uniform high magnetic fields between the divided parts of the superconducting magnet is provided. The probe coil is orthogonal to the direction of the uniform high magnetic field between the divided parts of the superconducting magnet.

As the material of the probe coil, a superconductor of extremely low resistance to high frequency current, such as magnesium diboride ($MgB_2$) or oxide superconductor is used. A coil part as a unit of the probe coil is a donut plate-type superconducting thin film made by a superconducting thin film formed on a substrate. A slit is formed in the radial direction in the donut plate-type superconducting thin film. The superconducting thin film is parallel with the uniform high magnetic field.

A capacitor is formed in a part of each of both end faces of the slit in the donut plate-type superconducting thin film. The superconducting thin film is capacitive-coupled to a normal metal lead used as a lead terminal via the capacitors. Plurality of coil parts as units constructing a coil which are disposed in parallel at predetermined intervals are connected in parallel or in series by the normal metal lead, thereby obtaining a solenoid coil.

A sample is introduced in the axial direction into the probe coil.

DESCRIPTION OF THE PREFERRED EMBODIMENTS

Nuclear magnetic resonance equipment of the invention will be described hereinbelow with reference to the drawings.

COMPARATIVE EXAMPLE

Figure 1:
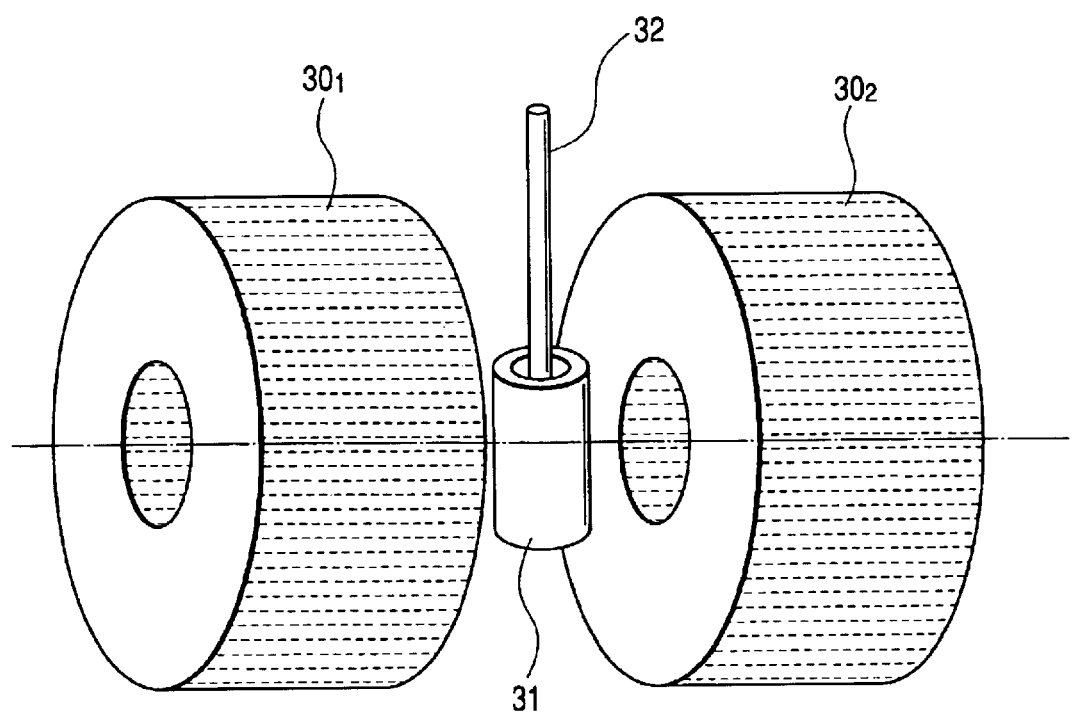
FIG. 1 is a schematic diagram illustrating the main parts of an example of NMR equipment which is an objective of this invention.

FIG. 1 is a perspective view schematically showing main parts of an example of NMR equipment which is an objective of the invention. By two divided superconducting magnets $30_1$ and $30_2$, a uniform magnetic field of 14.1 tesla (T) is generated along the center line indicated by an alternate long and short dash line. A cryo-probe 31 is disposed in the direction orthogonal to the center line of the magnetic field. A probe coil of the cryo-probe 31 can be cooled down to 10K. A sample tube 32 having an inner diameter of about 10 mm in which a sample having a diameter of 3 to 10 mm and a length of 5 to 10 mm is disposed is inserted to the heat-insulated inside of the probe 31. A cooling system, a signal system, and electric circuits are not shown here.

Figure 2:
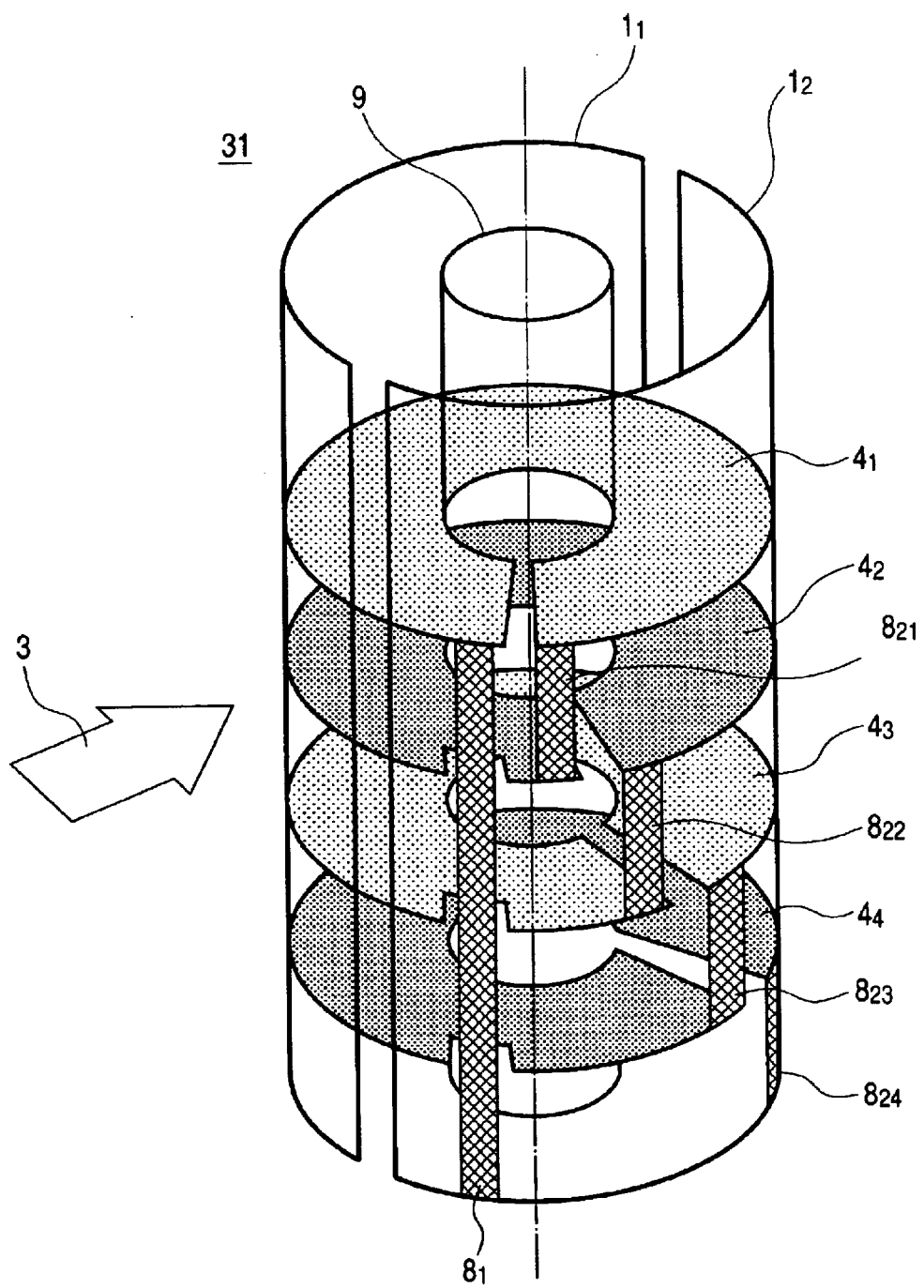
FIG. 2 is a schematic diagram illustrating a primary idea when a superconductor is applied to a solenoid-type cryogenic probe.
Figure 3:
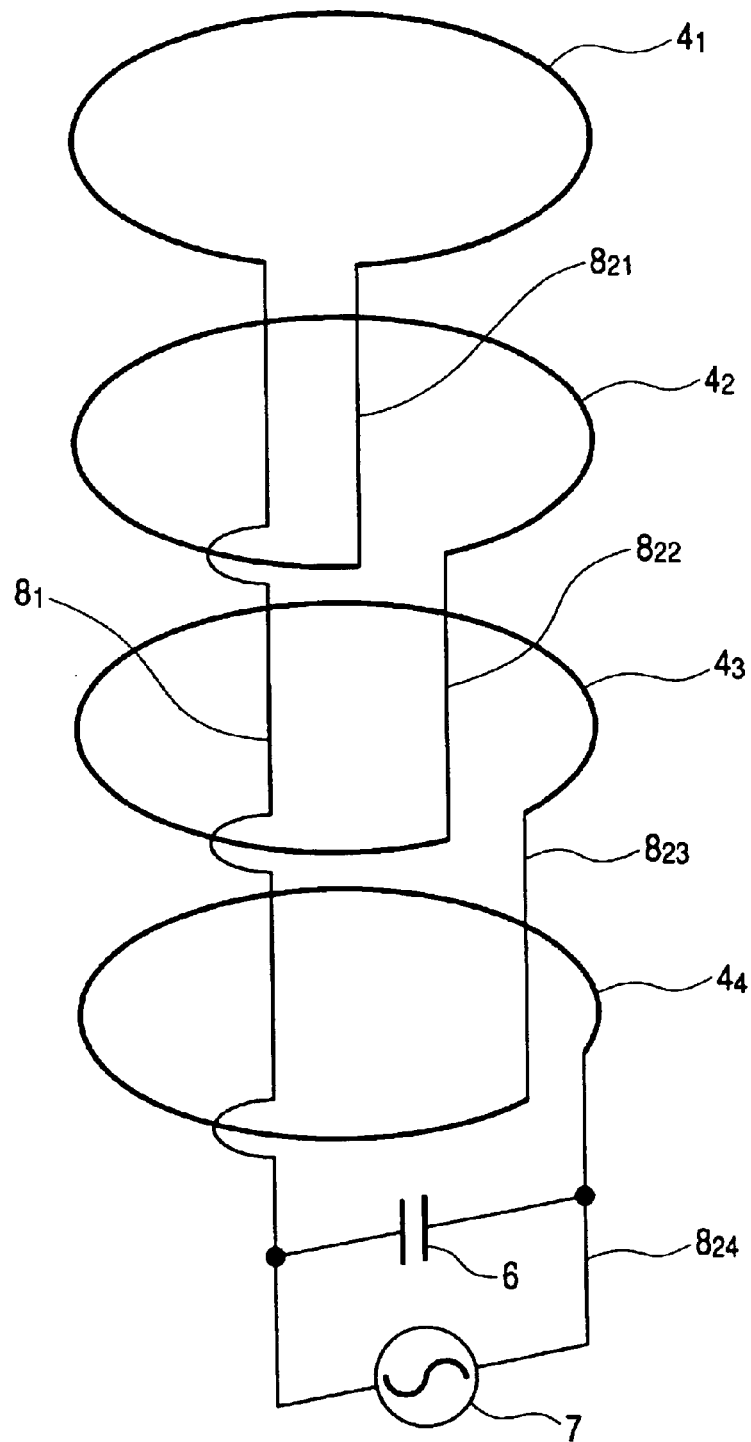
FIG. 3 is a circuit diagram corresponding to the probe in FIG. 2.

FIGS. 2 and 3 are diagrams each illustrating an example of a primary idea of a configuration and a connection circuit used when a superconductor is applied to the solenoid coil of the cryo-probe 31. FIG. 2 is a perspective view schematically showing the configuration of the solenoid coil, and FIG. 3 is a circuit diagram of a case where the coil is used.

In FIG. 2, reference numeral 3 denotes an arrow indicative of the direction of the uniform magnetic field generated by the superconducting magnets $30_1$ and $30_2$. Each of $4_1$, $4_2$, $4_3$, and $4_4$ denotes a donut-shaped coil part as a unit fabricated by a superconducting thin film formed on a donut plate-type substrate 2. The donut-shaped superconducting thin film has a slit extending in the radial direction by which the film is discontinued in the circumferential direction. The superconducting thin film coil parts $4_1$, $4_2$, $4_3$, and $4_4$ are disposed in parallel with each other at predetermined intervals. $1_1$ and $1_2$ denote two divided parts of an outer cylinder for holding the superconducting thin film coil parts $4_1$, $4_2$, $4_3$, and $4_4$. The outer cylinder is divided into halves for convenience of assembling work. Reference numeral 9 denotes an inner cylinder for holding the superconducting thin film coil parts $4_1$, $4_2$, $4_3$, and $4_4$. The superconducting thin film coil parts are maintained at predetermined intervals and held so as to be parallel with each other by the inner cylinder 9 and the outer cylinder 1. The superconducting thin film coil parts $4_1$, $4_2$, $4_3$, and $4_4$ as units constructing the coil are disposed so as to be parallel with the uniform magnetic field 3.

Reference numerals $8_1$, $8_{21}$, $8_{22}$, $8_{23}$, and $8_{24}$ denote normal metal leads. The lead 81 is connected to one end of the superconducting thin film coil part $4_1$ and led to the lower end of the probe 31. The lead $8_{21}$ connects one end of the superconducting thin film coil part $4_1$ and one end of the superconducting thin film coil part $4_2$. Similarly, the lead $8_{22}$ connects one end of the superconducting thin film coil part $4_2$ and one end of the superconducting thin film coil part $4_3$. The lead $8_{23}$ connects one end of the superconducting thin film coil part $4_3$ and one end of the superconducting thin film coil part $4_4$. The lead $8_{24}$ is connected to the other end of the superconducting thin film coil part $4_4$ and is led to the lower end of the probe 31. In such a manner, a solenoid coil-having four turns is constructed between the leads $8_1$ and $8_{24}$. To avoid occurrence of electric interference when the lead 81 passes the side faces of the other superconducting thin film coil parts $4_2$, $4_3$, and $4_4$, a slit is formed in the part where the lead $8_1$ passes in the superconducting thin film of each of the superconducting thin film coil parts $4_2$, $4_3$, and $4_4$.

In FIG. 2, to simplify the drawing, the donut plate-type substrate 2 on which the superconducting thin film coil part 4 is formed is not shown. Although the superconducting thin film coil parts 4 may have the same configuration, to make the relations among the coil parts easily understood, the pattern of the superconducting thin film coil parts $4_1$ and $4_3$ and that of the superconducting thin film coil parts $4_2$, and $4_4$ are made different from each other. The inner cylinder 1 and the outer cylinder 9 are made of, for example, sapphire and only the outlines of them are shown here.

FIG. 3 is a circuit diagram of the case where the solenoid coil constructed as shown in FIG. 2 is used as a transmit/receive coil of 600 MHz so as to be provided for NMR spectroscopy by being cooled to 10K via the inner cylinder 1 and the outer cylinder 9 made of sapphire. By connecting a capacitor 6 of small capacitance of 0.17 pF to both ends of the leads $8_1$ and $8_{24}$ of the solenoid coil in parallel with a radio-frequency power source 7, the resultant can be used as a transmit/receive coil of 600 MHz. It is, however, extremely difficult to manufacture the capacitor 6 of small capacity of 0.17 pF or the like with high reproducibility and the operation becomes unstable. Thus, it is not realistic for the radio-frequency NMR equipment.

Example 1

To perform NMR spectroscopy in a high frequency band exceeding 600 MHz, a structure realizing reduced inductance of a solenoid coil was examined. The solenoid coil applies a magnetic field to a sample to be measured having a diameter of 3 to 10 mm and a length of 5 to 10 mm, which is put in the sample tube 32, and for receiving a free induction decay (FID) signal. The number of turns of the coil was set to 3 or larger, and a concrete target is to achieve the capacitance of 3 pF or larger which can be realized, of a capacitor as a component of a resonator of 600 MHz.

Figure 4:
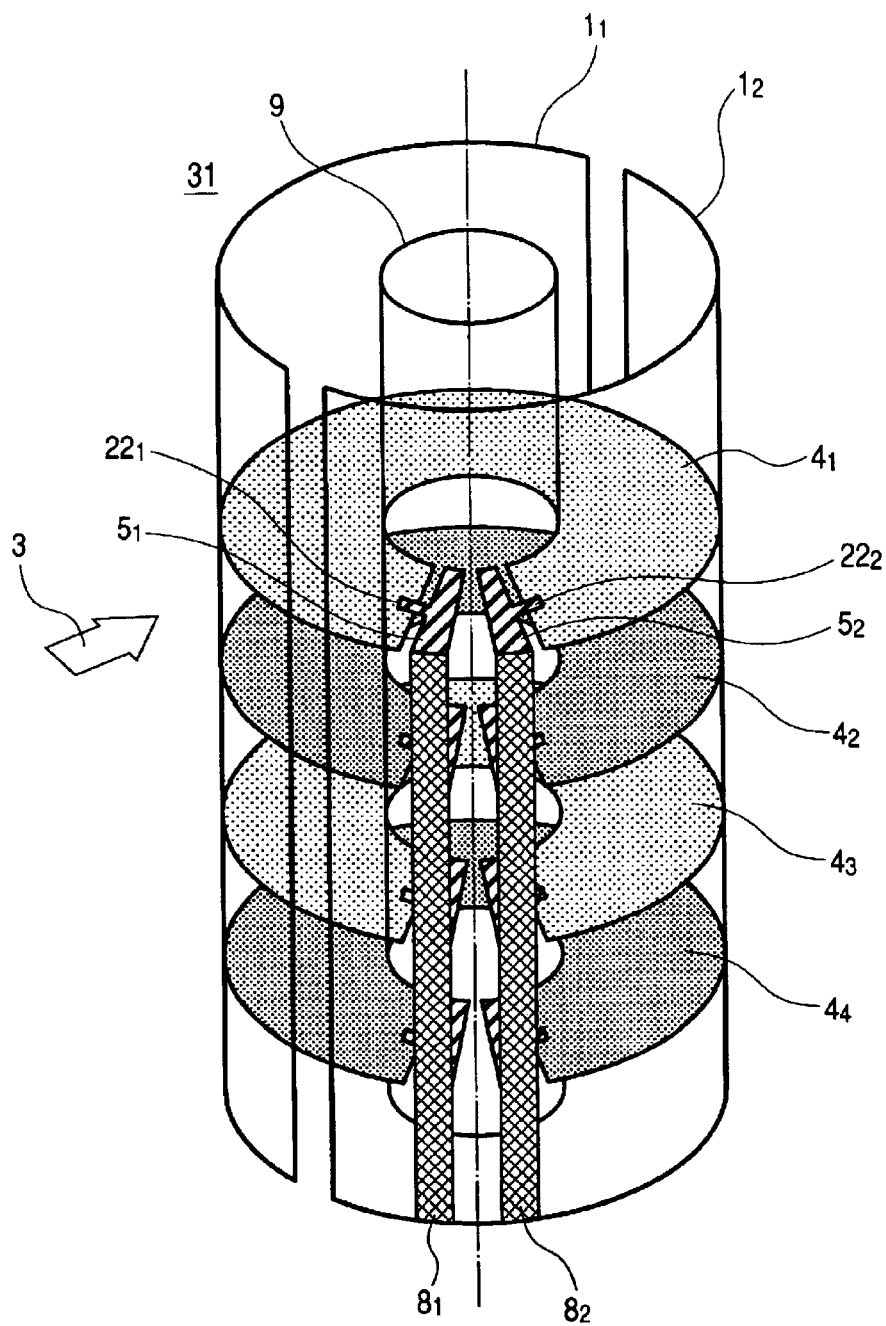
FIG. 4 is a schematic diagram of a probe coil for NMR equipment in Example 1.

FIG. 4 is a schematic figure of a probe coil for NMR equipment of Example 1. Like the configuration illustrated in FIG. 2, a donut plate-type coil part as a unit fabricated by a superconducting thin film formed on the donut plate-type substrate 2 (refer to FIG. 5B) and having a slit in the radial direction is basically employed. Also in FIG. 4, like FIG. 2, the donut plate-type substrate 2 is omitted and only outlines of the inner cylinder 9 and the outer cylinder 1 are shown. The patterns of the superconducting coil parts are made alternately different from each other so as to be distinguished from each other.

Each of the halves $1_1$ and $1_2$ of the outer cylinder 1 has a shape obtained by dividing a sapphire pipe having an outside diameter of 20 mm and an inside diameter of 16.5 mm into halves. The inner cylinder 9 is a sapphire pipe having an outside diameter of 14 mm and an inside diameter of 11 mm. The donut plate-type substrate 2 is a donut plate-type flat substrate having an outside diameter of 18 mm, an inside diameter of 14 mm, and a thickness of 0.75 mm and is made of sapphire ($Al_2O_3$) having a surface orientation of (0001). Four pieces of the donut plate-type substrates 2 are fixed at intervals of 3.3 mm. On one of the surfaces of the donut plate-type substrate 2, a donut plate-type coil part as a unit fabricated by the superconducting thin film 4 in which a slit is opened in the radial direction is formed. The superconducting thin film 4 is made of magnesium diboride ($MgB_2$). The magnesium diboride ($MgB_2$) superconducting thin film 4 was obtained by forming an amorphous $MgB_2$ film having a thickness of 250 nm on the surface of the donut plate-type substrate 2 made of sapphire by sputtering using a target in which B pellets are arranged on an Mg plate, heated at 400° C. at $2\times10^{-5}$ Torr for five minutes, and crystallized. The donut plate-type coil part made of the superconducting thin film 4 is disposed so as to be parallel with the uniform magnetic field 3 of the NMR equipment.

Although connection between the superconducting thin film and the normal metal lead was not mentioned by referring to FIG. 2, in the probe coil 31 for NMR equipment of Example 1, the impedance of a coil part as a unit is reduced and stable connection between the superconducting thin film 4 of the coil part and the normal metal lead 8 is achieved by devising the connection part. Reference numerals $5_1$ and $5_2$ denote Au thin films and are formed in the position of the slit which is formed in the radial direction of the superconducting thin film $4_1$ formed on the surface of the donut plate-type substrate 2. Reference numerals $22_1$ and $22_2$ denote overlap portions of the Au thin film 5 extended on the superconducting thin film 4 via an interlayer dielectric thin film 24. Although the Au thin film 5 and the overlap portion 22 are similarly formed on the other superconducting thin films 4, they are behind the normal metal leads $8_1$ and $8_2$ in FIG. 4 and are seen only partly. The coil parts as units formed by the superconducting thin films 4 are connected in parallel and are led to the lower end of the probe 31 by the normal metal leads $8_1$ and $8_2$ via the capacitor as will be described later.

Figure 5A:
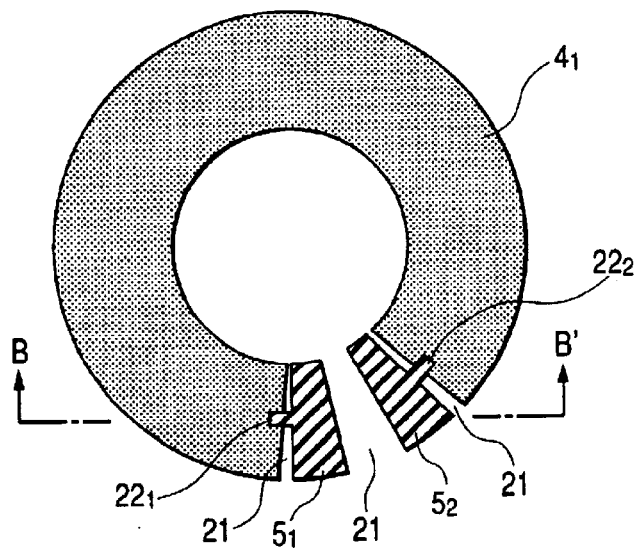
FIG. 5A is a plane figure illustrating a structure consisting of a coil part made of a superconducting film and an Au thin film.
Figure 5B:
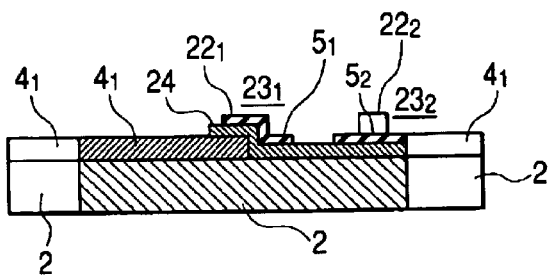
FIG. 5B is a cross-sectional figure at B–B' in FIG. 5A.

FIG. 5A is a plane figure illustrating the relation between the coil part formed by the superconducting thin film 4 and the Au thin film 5 and FIG. 5B is a diagram taken along ling B–B' of FIG. 5A.

The superconducting thin film 4 is formed on one of the surfaces of the donut plate-type substrate 2. A part of the superconducting thin film 4 is removed by etching, thereby forming a slit 21. After that, an aluminum nitride (AlN) film 23 is formed so as to cover the slit 21 including a part of both ends of the superconducting thin film 4. In a manner similar to the superconducting thin film 4, the aluminum nitride film 23 is formed by sputtering aluminum in nitrogen atmosphere by using a metal mask. After that, the Au thin film 5 is deposited and a pattern is formed so that the Au thin film 5 partially overlaps the superconducting thin film 4, thereby forming the overlap portions $22_1$ and $2_{22}$. The slit 21 is formed at a pitch of 15°, and the Au thin film 5 and the overlap portions $22_1$ and $22_2$ are formed in the slit 21 close to the superconducting thin film 4. The outer circumferential portion of the donut plate-type substrate 2 of the Au thin film 5 is connected to the normal metal leads $8_1$ and $8_2$.

The normal metal leads $8_1$ and $8_2$ and the Au thin film 5 are in direct contact with each other but the superconducting thin film 4 and the normal metal leads $8_1$ and $8_2$ are not in direct contact with each other. As understood from FIG. 5B, by sandwiching the aluminum nitride (AlN) film 24 between the Au thin film 5 and the superconducting thin film 4, capacitors $23_1$ and $23_2$ are formed in the overlap portions $22_1$ and $22_2$, respectively. In the invention, consequently, the normal metal lead 8 and the coil formed by the superconducting thin film coil parts 4 are connected via the capacitor 23. As a result, the value of inductance evaluated between the normal metal leads $8_1$ and $8_2$ can be made low.

In Example 1, the capacitance of the capacitor 23 can be designed to 4 pF by making the interlayer dielectric thin film 24 of AlN, setting the thickness to 250 nm, and setting the size of the overlap portion 22 to 6 $\mu$m×6 $\mu$m. Although the capacitance of the capacitor 23 was 4 pF in Example 1, it was found by computer simulation that by changing the size of the overlap portion 22, the capacitor 23 having capacitance in the range from 20 to 50 pF can be realized.

Figure 5C:
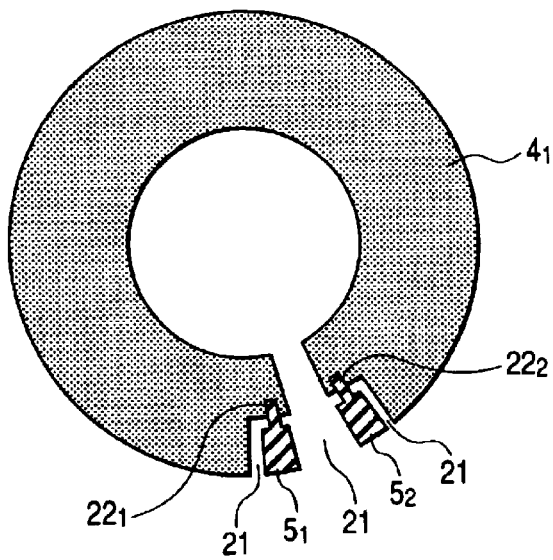
FIG. 5C is a plane figure illustrating another type of structure consisting of a coil part made of a superconducting film and an Au thin film.

FIG. 5C is a plane figure showing another form of the relation between the coil part formed by the superconducting thin film 4 and the Au thin film 5. Specifically, in a manner similar to the above, a superconducting coil part is formed by slitting a part of the superconducting thin film 4, and the Au thin film 5 and the capacitor 23 as pieces in contact with the normal metal lead are formed in the slit 21. By limiting the position of forming the Au thin film 5 and the capacitor 23 to a portion almost the half of the width in the circumferential direction of the superconducting thin film 4, the effective length of the coil part formed by the superconducting thin film 4 can be increased.

Figure 6:
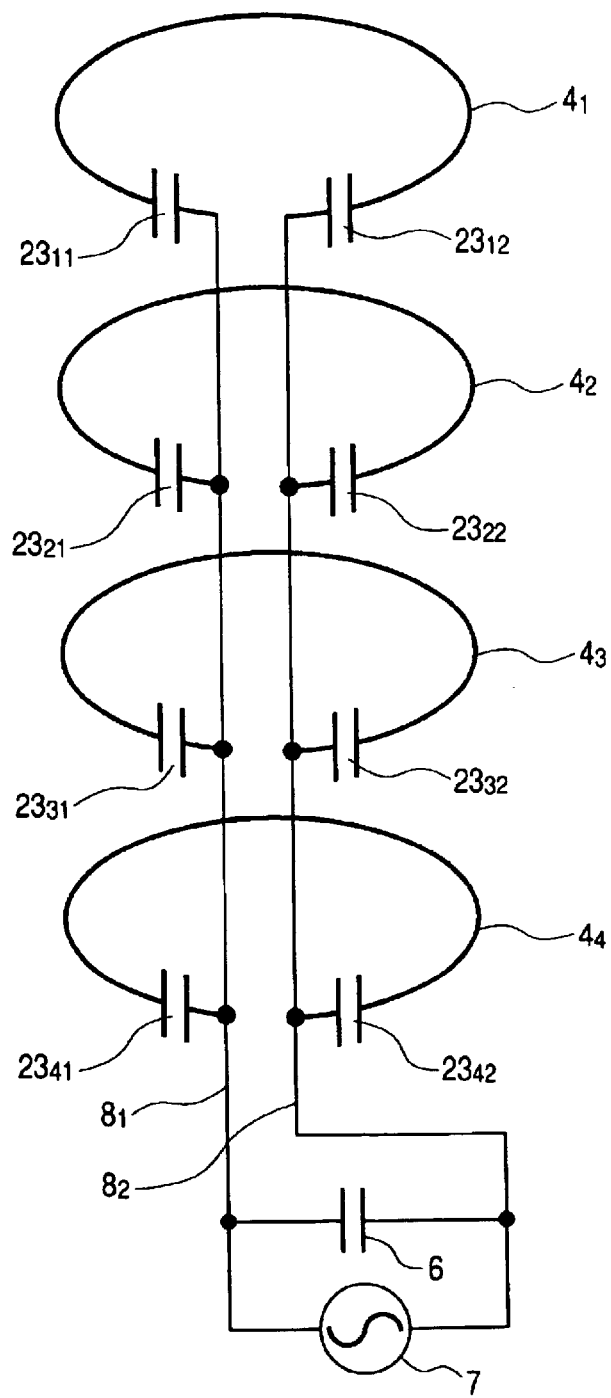
FIG. 6 is a circuit diagram of a probe coil for NMR equipment shown in FIG. 5, the probe coil being used as a transmitter and receiver coil at 600 MHz.

FIG. 6 is a circuit diagram of the case where the probe coil 31 for the NMR equipment illustrated in FIG. 5 is used as a transmit/receive coil of 600 MHz. The normal metal lead 8 and the coil part as a unit made by the superconducting thin film 4 are connected to each other via the capacitor 23. Specifically, the superconducting thin film coil parts $4_1$, $4_2$, $4_3$, and $4_4$ are connected to the normal metal leads $8_1$ and $8_2$ in parallel via the capacitors $23_{11}$ and $23_{12}$ in series, capacitors $23_{21}$ and $23_{22}$ in series, capacitors $23_{31}$ and $23_{32}$ in series, and capacitors $23_{41}$ and $23_{42}$ in series, respectively.

With the configuration, the value of inductance evaluated between the normal metal leads $8_1$ and $8_2$ could be made low. As a result, a transmit/receive coil in which the capacitance of the capacitor 6 connected in parallel between the feeding points of the normal metal leads $8_1$ and $8_2$ is set to 40 pF was obtained. By connecting the radio-frequency power source 7 in parallel with the transmit/receive coil, the transmit/receive coil of 600 MHz which functions stably could be obtained. The coil parts as units of the coil, formed by the superconducting thin films 4 on the donut plate-type substrates 2 are electrically connected to each other via the normal metal lead 8 by the Au thin film formed by evaporation on the inner surface of the outer cylinder 1.

Figure 7:
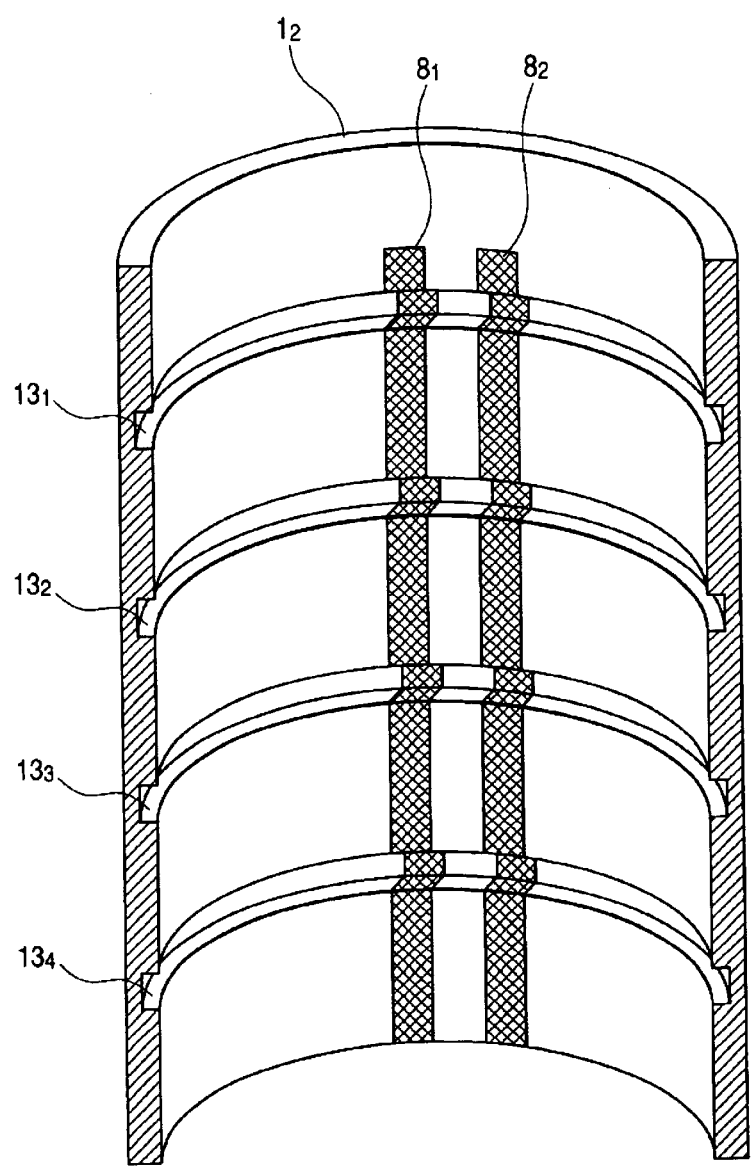
FIG. 7 is a schematic figure illustrating a method for fixing a donut plate-type substrate on which a superconducting film is formed, to an outer cylinder.
Figure 8:
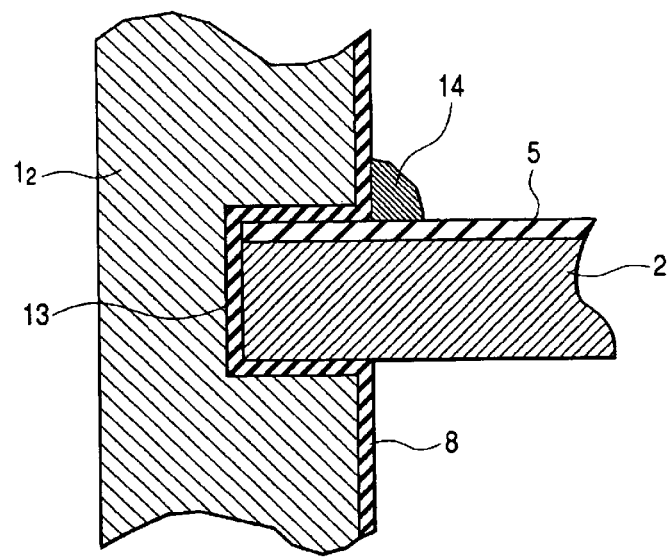
FIG. 8 is a schematic figure illustrating a method for connecting an Au thin film on a donut plate-type substrate on which a superconducting film is formed, to a normal metal lead wire.

FIGS. 7 and 8 are diagrams illustrating fixation of the donut plate-type disc substrate 2 on which the superconducting thin film 4 is formed to the outer cylinder 1 and connection between the Au thin film 5 and the normal metal lead 8.

As shown in FIG. 7, grooves $13_1$, $13_2$, $13_3$, and $13_4$ were provided at intervals corresponding to the intervals of the superconducting thin film coil parts $4_1$, $4_2$, $4_3$, and $4_4$ as units of the coil in the inner surface of the divided part $1_2$ of the outer cylinder 1. The depth of the groove 13 was set to 0.5 mm in correspondence with the outer diameter of the donut plate-type substrate 2 which was set to 18 mm in relation with the inner diameter of 16.5 mm of the outer cylinder 1. Since the thickness of the donut plate-type substrate 2 was set to 0.75 mm, the width of the groove 13 was set to 0.77 mm in correspondence with the thickness. The pitch of arranging the grooves 13 was set to 3.3 mm since the pitch of arranging the donut plate-type substrates 2 was set to 3.3 mm. An Au thin film was formed by evaporation on the inner surface of the half $1_2$ of the outer cylinder 1 and the normal metal leads $8_1$ and $8_2$ were patterned.

FIG. 8 is a cross section showing a part of the groove 13 in the normal metal lead 8 illustrated in FIG. 7. The normal metal lead 8 is formed by the Au thin film and, in the portion of the groove 13, recessed along the groove 13. The substrate 2 is inserted in the groove 13 so that the Au thin film 5 of the donut plate-type substrate 2 on which the superconducting thin film 4 and the Au thin film 5 are formed is positioned in the place where the normal metal lead 8 is formed in the groove 13. To secure electric contact between the normal metal lead 8 and the Au thin film 5 and fixation of the donut plate-type substrate 2, indium 14 is adhered by ultrasound as shown in FIG. 8. After insertion of all of the donut plate-type substrates 2 into the grooves 13, the inner cylinder 9 is inserted on the inside of the donut plate-type substrates 2. Further, the four donut plate-type disc substrates 2 are sandwiched by the other half $1_2$ of the outer cylinder 1, and the halves $1_1$ and $1_2$ of the outer cylinder 1 are fixed in a cylindrical shape by a thermal-contraction tube.

The fabricated 4-layer parallel coil was measured and tested. By using the superconducting thin film 4, the sensitivity became 3.5 times as high as that in the case of using a copper coil.

Figure 9:
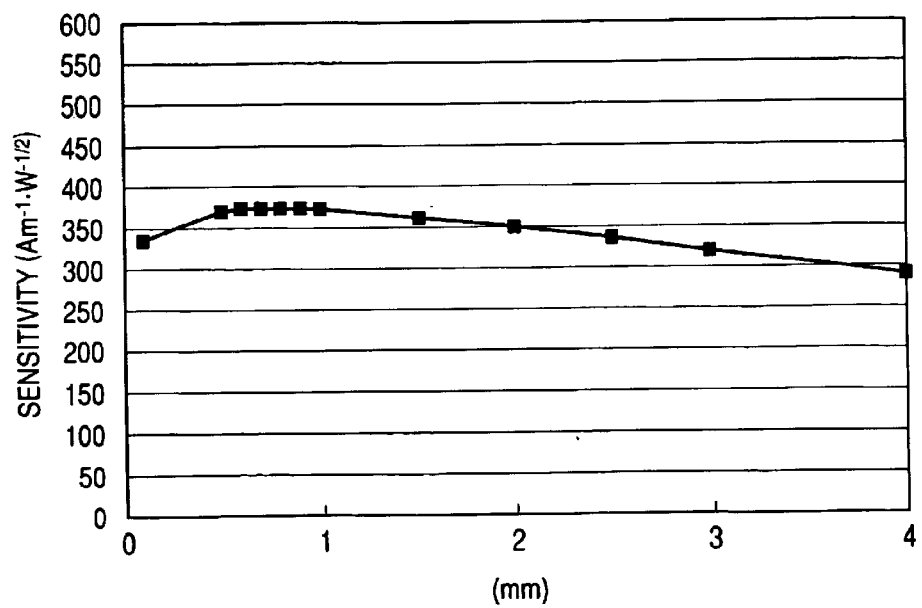
FIG. 9 is a figure showing the dependency of sensitivity of a superconducting coil on the width.

FIG. 9 is a diagram showing dependency on width of the sensitivity of the superconducting coil 4. Although the width of the superconducting coil 4 was 2 mm in Example 1, the width was changed from 0.3 mm to 4 mm. It is understood from the result that, when the width is increased, the conductor resistance and inductance decrease and the sensitivity improves. On the other hand, when the coil becomes larger, the outer diameter of the probe increases. Consequently, the distance from the sample increases and the sensitivity deteriorates. In addition, a contradictory effect occurs such that the uniformity of a static magnetic field $B_0$ deteriorates. Thus, it was clarified that the width of the superconducting thin film 4 is preferably in the range from 0.5 mm to 2 mm, more preferably, from 0.5 mm to 1 mm.

To maintain high uniformity of the uniform magnetic field $B_0$, the surface of the superconducting thin film has to be parallel with the uniform magnetic field $B_0$. Consequently, in Example 1, the grooves are formed on the inside of the supporting member for supporting the probe from the outside, and the donut plate-type substrates 2 are inserted and fixed in the grooves. In such a manner, the superconducting thin film 4 formed on the donut plate-type substrate 2 can be made parallel with the uniform magnetic field $B_0$. This assembly manner can be also applied in the following other examples.

Example 2

A 4-layer parallel coil was formed in the same structure as that in Example 1 except that magnesium diboride ($MgB_2$) was changed to $YBa_2Cu_3O_y$ (YBCO) as one of oxide superconductors. The donut plate-type substrate 2 was made of an La—Sr—Al—Ta oxide and the YBCO superconducting thin film 4 was formed by the pulsed laser deposition method. The same film thickness of 250 nm was used. The interlayer dielectric thin film 24 for forming the capacitor 23 between the superconducting thin film 4 and the normal metal lead 8 was formed by depositing cerium oxide ($CeO_2$) by using a metal mask by laser vapor deposition in a manner similar to the superconducting thin film 4.

After that, the Au thin film 5 was deposited in a manner similar to Example 1 and a pattern was formed so that the superconducting thin film 4 and the Au thin film 5 overlap partially. The slit 21 and the Au thin film 5 were formed at the pitch of 15 degrees, and the thickness of the Au thin film 5 was set to 200 nm. To enhance the adhesion strength between the cerium oxide ($CeO_2$) 24 and the Au thin film 5, after deposition of the Au thin film 5, heat treatment was carried out at 400° C. for one hour in oxygen. The interlayer dielectric thin film 24 was made of $CeO_2$ and had a thickness of 300 nm, and the size of the overlap portion 22 was set to 6 $\mu$m×6 $\mu$m, thereby enabling a capacitor having capacitance of 4 pF to be fabricated.

The fabricated 4-layer parallel coil was measured and tested at 600 MHz. As a result, the sensitivity was improved by 3.5 times as high as that in the case of using a copper coil and the difference due to the superconductor material different from that of Example 1 was not found out.

Example 3

Figure 10:
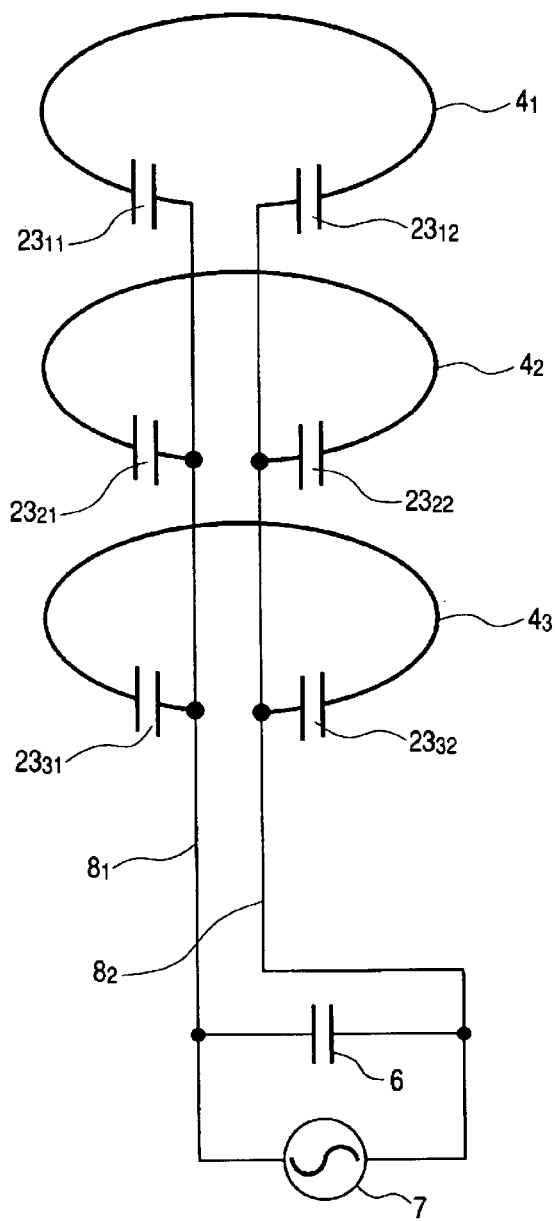
FIG. 10 is a circuit diagram for the case of three superconducting films in the same structure as that of Example 2.

The same structure as that in Example 2 was employed except that the number of superconducting thin films was set to three. FIG. 10 is a circuit diagram showing connection.

The superconducting thin film 4 used in Example 3 is a YBCO film in a manner similar to Example 1 and an $LaAlO_3$ having a surface orientation of (001) was used for the donut plate-type substrate 2. The normal metal electrode constructing the capacitor 23 was formed by using an Ag thin film in place of the Au thin film. The thickness of the Ag thin film was 250 nm. To decrease the contact resistance between the $CeO_2$ interlayer dielectric thin film and the Ag thin film, also in Example 3, the Ag thin film was vapor deposited and, after that, heat treatment at 400° C. for one hour was carried out in oxygen.

The fabricated 3-layer parallel coil was measured and tested at 600 MHz. As a result, though the sensitivity decreases as compared with that in the case of Example 1, the sensitivity was three times as high as that in the case of using a copper coil.

Further, also in the case where a normal metal electrode was made of an alloy of gold and silver in place of the Ag thin film, sensitivity equal to or higher than that in the case of using the Ag thin film could be realized.

Example 4

Figure 11:
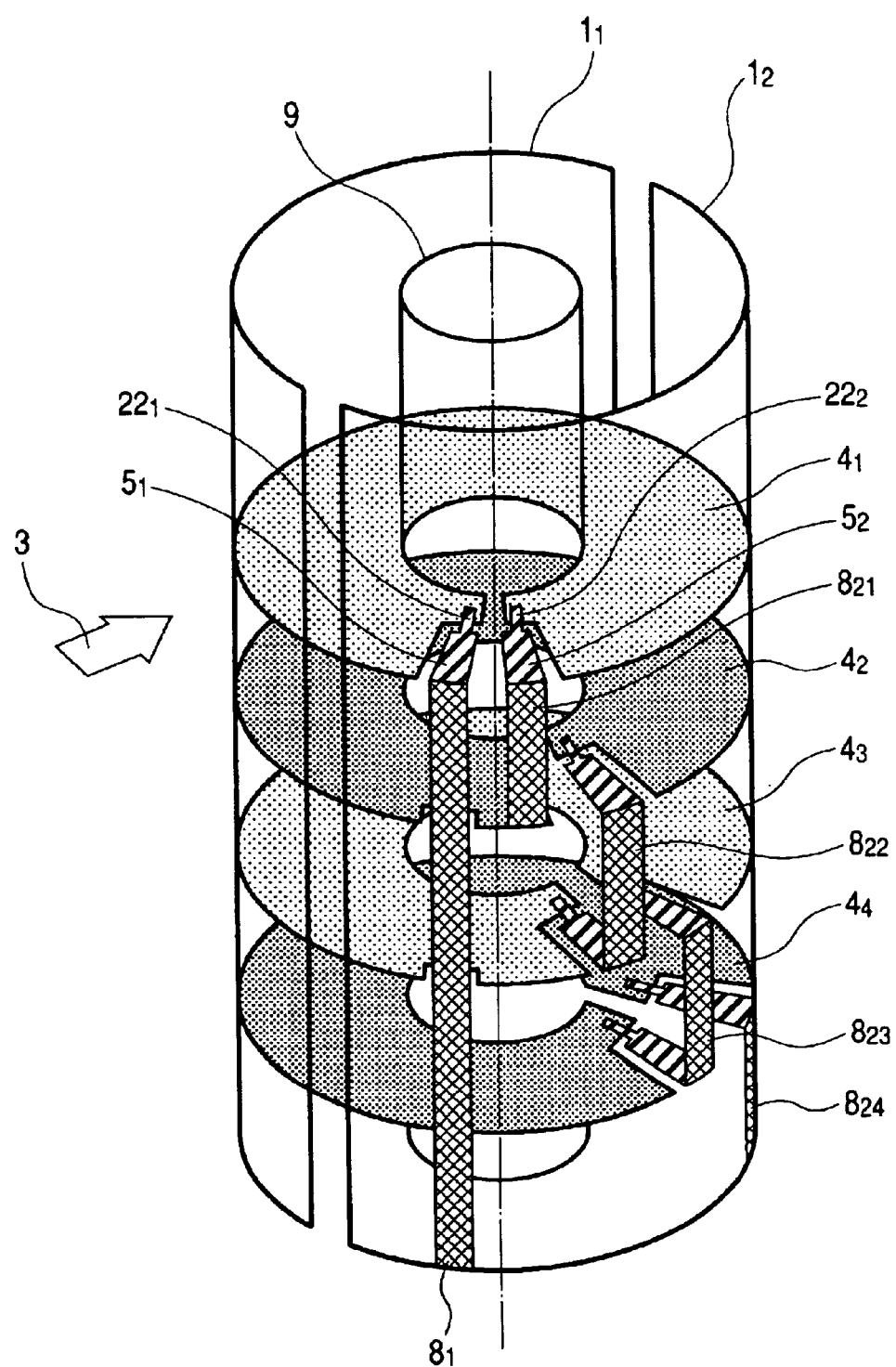
FIG. 11 is a schematic figure of a solenoid coil constructed by connecting four superconducting coil parts in series.
Figure 12A:
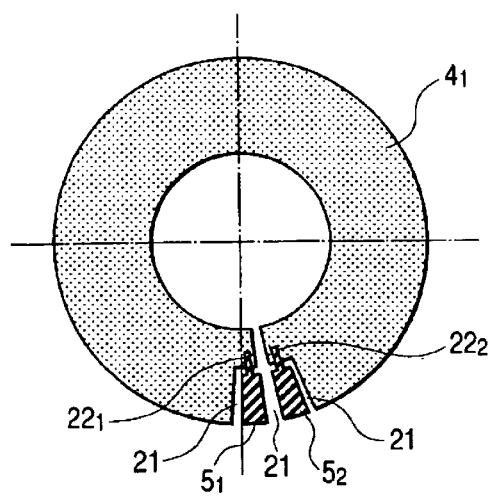
FIGS. 12A to 12D are plane figures showing the superconducting coil parts in FIG. 11.
Figure 12B:
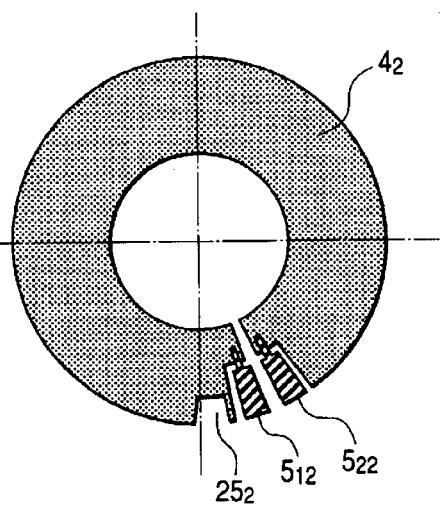
Figure 12C:
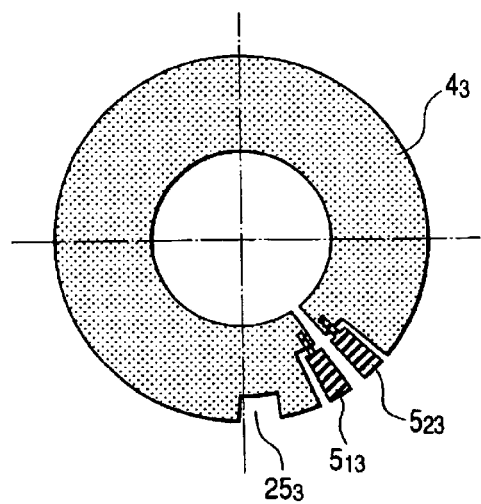
Figure 12D:
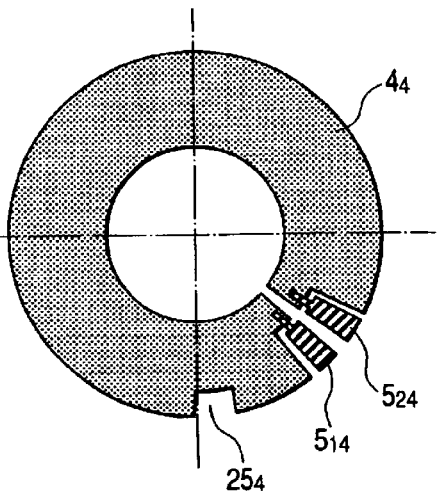
Figure 13:
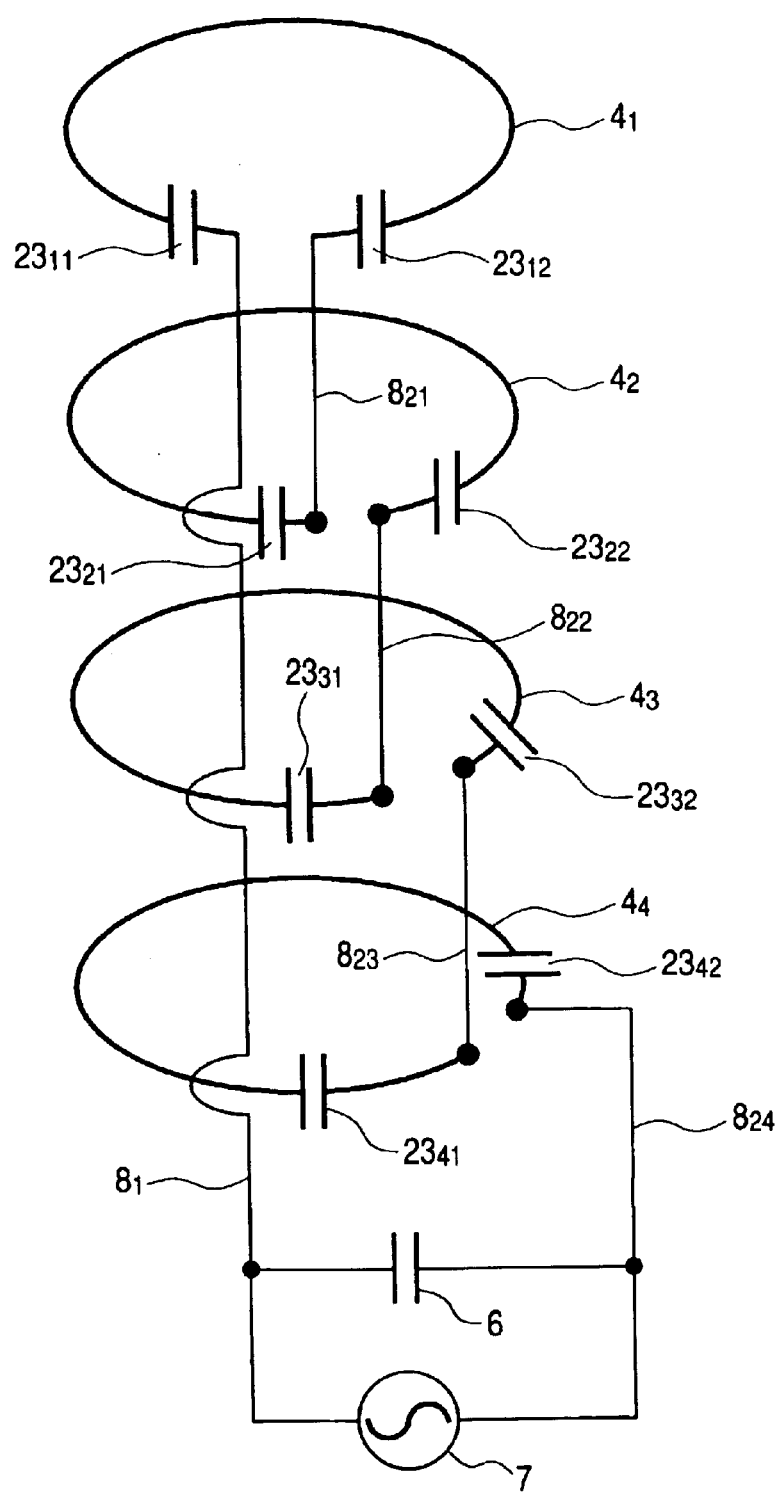
FIG. 13 is a circuit diagram showing connection of the superconducting coil parts in FIG. 11.

A solenoid coil was formed by connecting four superconducting thin film coil parts 4 in series. FIG. 11 is a schematic diagram of the coil, FIGS. 12A to 12D are plane figures of the superconducting thin film coil parts $4_1$, $4_2$, $4_3$, and $4_4$ forming the coil, and FIG. 13 is a diagram showing connection of the superconducting thin film coil parts. Also in FIG. 11, in a manner similar to FIGS. 2 and 4, the donut plate-type substrate 2 is omitted and only outlines of the inner cylinder 9 and the outer cylinder 1 are shown. The patterns of the superconducting coil parts are made alternately different from each other so as to be distinguished from each other.

In a manner similar to Example 1, the superconducting coil part 4 and the normal metal electrode formed by the Au thin film 5 are connected to each other via the capacitor 23, and the Au thin film 5 and the normal metal lead 8 are connected to each other. The same reference numerals are assigned to parts of the coil in FIG. 11 equivalent to those of FIG. 4 as a schematic diagram of the coil of Example 1. In Example 4, to connect the superconducting thin film coil parts $4_1$, $4_2$, $4_3$, and $4_4$ in series, as obvious from comparison between FIGS. 11 and 4, the positions of the normal metal electrodes formed the Ag thin films 5 are deviated sequentially by 7.5° corresponding to the width of one normal metal electrode formed by the Ag thin film 5.

The start end of the superconducting thin film coil part $4_1$ is led by the normal metal lead $8_1$ in a manner similar to FIG. 4 but the other end of the coil part $4_1$ is led by the metal lead $8_{21}$ and connected to the start end of the coil part $4_2$. Similarly, ends of the superconducting thin films are sequentially connected via the metal leads $8_{22}$ and $8_{23}$ and the other end of the last thin film coil part $4_4$ is led by the metal lead $8_{24}$.

The pattern structure of the overlap portion 22 as a component of the capacitor 23 shown in FIG. 5C was employed. In such a manner, the effective length of the superconducting coil 4 can be increased.

FIGS. 12A to 12D are diagrams concretely showing the positional relations between the superconducting coil parts $4_1$, $4_2$, $4_3$, and $4_4$ and the normal metal electrode formed by the Ag thin film 5. The diagrams also show notches $25_2$, $25_3$, and $25_4$ in the superconducting coil parts $4_2$, $4_3$, and $4_4$ provided for avoiding interference between the normal metal electrode formed by the Ag thin film 5 and the normal metal lead $8_1$. As understood from comparison between FIGS. 11 and 12, the normal metal electrode $5_2$ formed by the Au thin film 5 of the superconducting coil part $4_1$ and the normal metal electrode $5_{12}$ formed by the Au thin film 5 of the superconducting coil part $4_2$ are connected to each other via the normal metal lead $8_{21}$. Similarly, the normal metal electrode $5_{22}$ formed by the Au thin film 5 of the superconducting coil part $4_2$ and the normal metal electrode $5_{13}$ formed by the Au thin film 5 of the superconducting coil part $4_3$ are connected to each other via the normal metal lead $8_{22}$. The normal metal electrode $5_{23}$ formed by the Au thin film 5 of the superconducting thin film $4_3$ and the normal metal electrode $5_{14}$ formed by the Au thin film 5 of the superconducting thin film $4_4$ are connected to each other via the normal metal lead $8_{23}$. The normal metal electrode $5_{24}$ formed by the Au thin film 5 of the superconducting thin film $4_4$ is led by the normal metal lead $8_{24}$.

FIG. 13 is a connection diagram showing connection among the superconducting coil parts $4_1$, $4_2$, $4_3$, and $4_4$. The circuit configuration of the superconducting coil parts $4_1$, $4_2$, $4_3$, and $4_4$ is similar to that of Example 1 shown in FIG. 6. Example 4 is different from Example 1 with respect to the point that the superconducting coil parts $4_1$, $4_2$, $4_3$, and $4_4$ are arranged in series.

Figure 14:
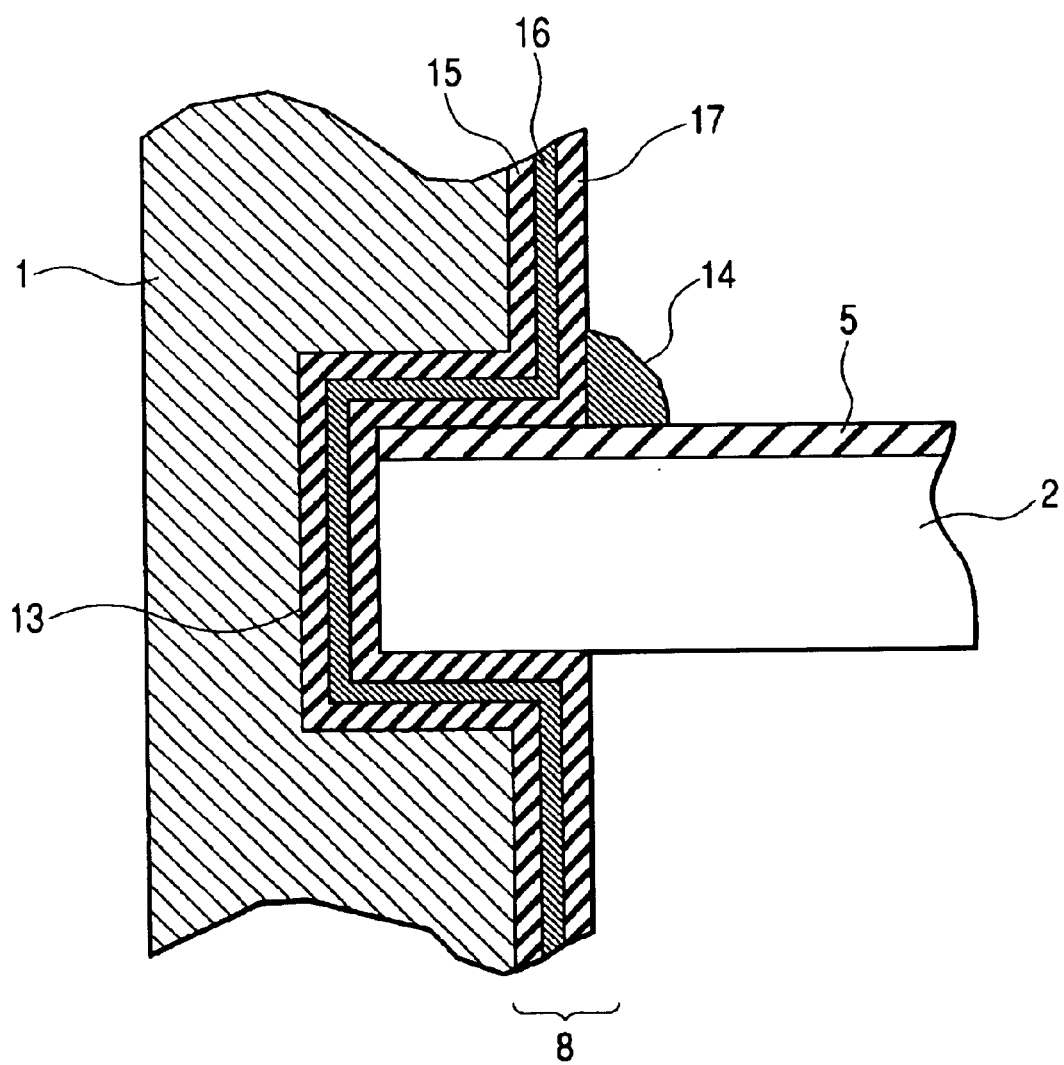
FIG. 14 is a cross section of a layered structure ($Au/SiO_2/Au$) for the normal metal lead shown in Example 4.

Fixation of the donut plate-type substrate 2 to the halves 11 and 12 of the outer cylinder 1 and connection between the superconducting coil part 4 and the normal metal lead 8 are similar to those of Example 1. However, different from Example 1, since connection among the superconducting coil parts $4_1$, $4_2$, $4_3$, and $4_4$ is different from that of the normal metal leads $8_{21}$, $8_{22}$, and $8_{23}$, the normal metal lead $8_2$ has to be patterned accordingly. In Example 4, as shown in FIG. 14, the normal metal lead 8 has a three-layer structure of an Au layer 15, an $SiO_2$ layer 16, and an Au layer 17. The Au layer 15 has a thickness of 200 nm, the $SiO_2$ layer 16 has a thickness of 300 nm, and the Au layer 17 has a thickness of 200 nm. The Au layer 15 is grounded. In a manner similar to the case of Example 1 shown in FIG. 8, the indium 14 was adhered by ultrasound to the Au layer 17 and the normal metal electrode 5.

The manufactured four-layered serial superconducting coil was measured and tested at 600 MHz. As a result, by using the superconducting thin film, the sensitivity improves by 2.7 times as high as that in the case of using a copper coil. Since the superconducting coil parts $4_1$, $4_2$, $4_3$, and $4_4$ are connected via the capacitors 23, also in the case of using the coil at 600 MHz, the capacitance of the capacitor 6 connected in parallel with the feeding point increases to 2.7 pF. Thus, reproducibility improves.

Example 5

In the same basic structure as that in Example 4, three superconducting thin films were connected in series, thereby forming a solenoid coil. Although the Au thin film is used for the normal metal lead 8 for connecting the superconducting coil parts $4_1$, $4_2$, $4_3$, and $4_4$ and the normal metal lead 8 for leading in the foregoing examples, a stacked structure of copper (Cu) and aluminum (Al) was employed to prevent the uniform magnetic field 3 from being distorted by the normal metal lead 8 whose film surface is perpendicular to the uniform magnetic field 3. The relative permeability constant of Cu is 0.999991 which is slightly smaller than 1 and that of Al is 1.0000002 which is slightly larger than 1. By stacking a Cu layer and an Al layer so that the average relative permeability constant of Cu and Al becomes 1, the relative permeability constant can be set to be extremely close to 1.

At the time of patterning the normal metal lead 8 on the inner surface of the sapphire outer cylinder 1 by evaporation, the thickness of Cu was set to 200 nm and that of Al was set to 100 nm. In a manner similar to Example 4, the coil was measured and tested at 600 MHz and it was found that the capacitance of the capacitor 6 connected in parallel with the feeding point increased to 3.6 pF at the same sensitivity as that in the case of parallel connection.

Example 6

Figure 15:
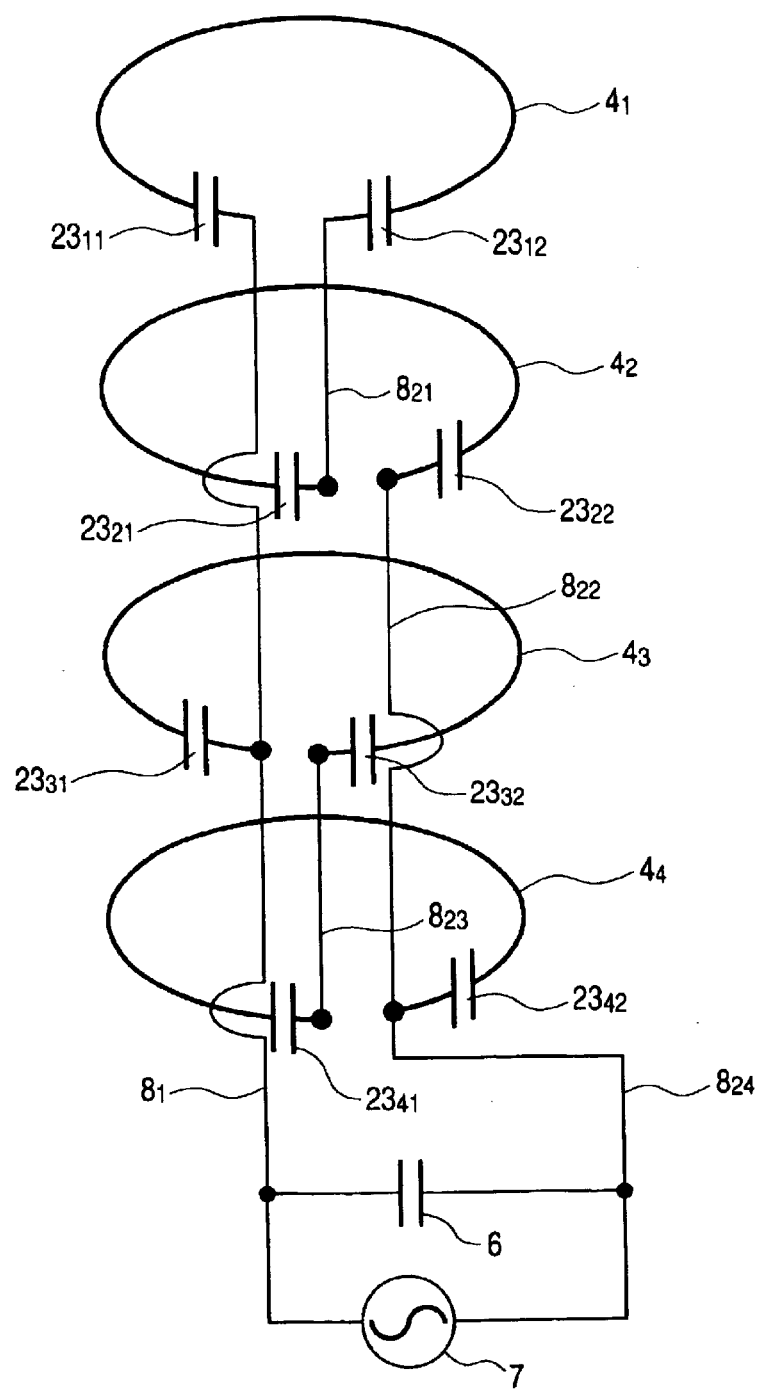
FIG. 15 is a circuit diagram of Example 6.

In the case where all of the superconducting coil parts $4_1$, $4_2$, $4_3$, and $4_4$ are connected in series as in Example 1, even in the case of the invention, the value of inductance becomes large. Consequently, the capacitance of the capacitor 6 connected to the feeding point has to be reduced, so that it is disadvantageous for measurement at higher frequency. In Example 6, two pairs of superconducting coil parts each connected in series were connected in parallel. FIG. 15 is a circuit diagram schematically showing Example 6. The superconducting coil parts $4_1$ and $4_2$ were connected in series, the superconducting coil parts $4_3$, and $4_4$ were connected in series, and the pairs were connected in parallel. The same reference numerals as those in FIG. 13 showing the connection circuit of Example 4 were designated. The same pattern structure of the overlap portion 22 in the capacitor 23 as that of FIG. 5C in Example 4 was employed. With the configuration, the effective length of the superconducting coil 4 can be increased.

Figure 16:
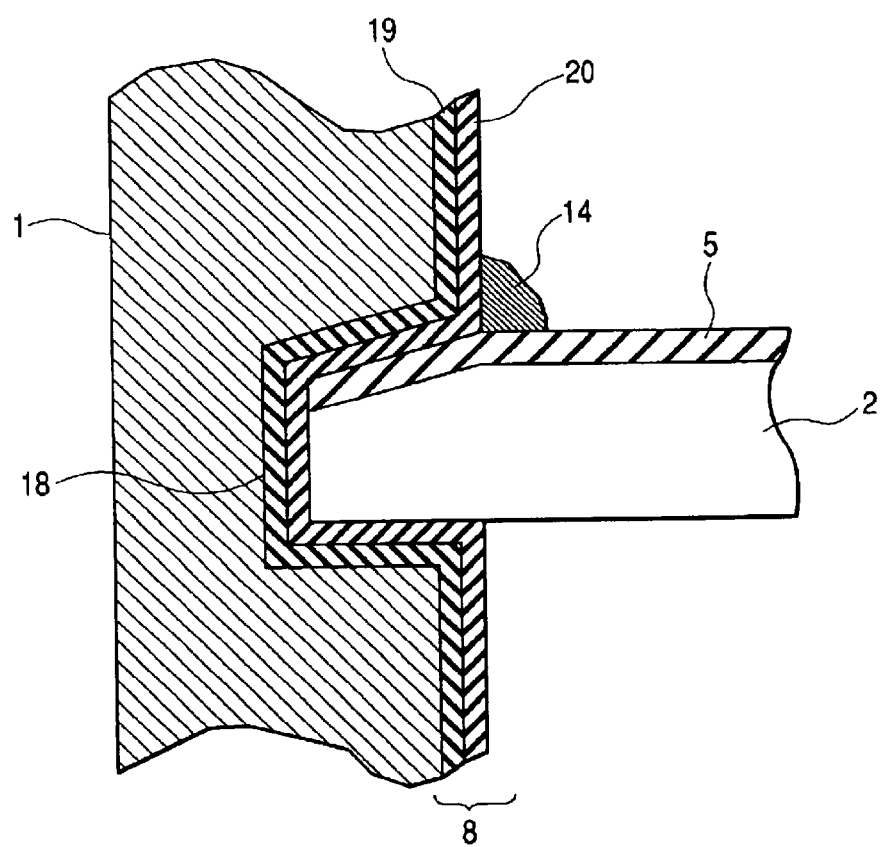
FIG. 16 is a schematic figure illustrating an improved method for fixing a donut plate-type substrate to an outer cylinder shown in Example 6.

Further, the method of fixing the donut plate-type substrate 2 to the outer cylinder 1 was improved. FIG. 16 is a diagram illustrating the improved fixing method of Example 6. Like FIG. 8 illustrating the fixing method of Example 1, a section of a portion of a groove 18 in a part of the normal metal lead 8 is shown. The groove 18 as a tapered notch having a width of 0.75 mm, a depth of 0.5 mm, and an inclination angle of 10 to 15° was formed in the outer cylinder 1. The normal metal lead 8 employs a stacked structure of copper (Cu) and aluminum (Al) explained in Example 5. A Cu thin film 19 and an Al thin film 20 were formed with the same thickness as that in Example 5, and the pattern of the normal metal lead 8 for connecting the coil to the inner surface of the outer cylinder 1 was formed. On the other hand, the outer periphery of a width of 0.5 mm of the donut plate-type substrate 2 was tapered at the inclination angle of 10°, and the superconducting thin film 4 and the Au thin film 5 were formed on the processed substrate. Four donut plate-type substrates 2 were sandwiched by the two halves $1_1$ and $1_2$ of the outer cylinder 1 so as to be inserted in the notches 18 in the outer cylinder 1, and the outer cylinder 1 was fixed by a thermal contraction tube. Further, in a manner similar to Example 1, to secure electric contact between the normal metal led 8 and the Au thin film 5 and fixation of the donut plate-type substrate 2, the indium 14 was adhered by ultrasound.

The taper formed on the inside of the outer cylinder 1 may not be necessarily formed on the Au thin film 5 side but may be formed on the side on which the substrate 2 is exposed. Alternately, tapers may be formed on both sides. In any of the cases, obviously, the periphery of the donut plate-type substrate 2 should be formed in a shape corresponding to the taper.

Test was made at 600 MHz in a manner similar to Example 1 and it was found that the capacitance of the capacitor 6 connected in parallel with the feeding point increased to 10.4 pF at the same sensitivity as that in the case where four superconducting coil parts 4 of Example 1 are connected in parallel.

Sensitivity in Various Coil Shapes and Necessary Capacitance of Capacitor 6

With respect to the connection forms of the series connection, the parallel connection, and the series and parallel connection of the coil parts and the connection of the lead wire by the normal metal lead 8 in Examples 1 to 6, the sensitivity of the probe coil and the necessary capacitance of the capacitor 6 in the case where the normal metal lead 8 and the superconducting coil were connected in series (direct connection) as shown in FIG. 2 and the case where the normal metal lead 8 and the superconducting coil were connected so as to interpose the capacitor 23 between them were evaluated. The capacitance of the capacitor 23 constructed between the normal metal lead 8 and the superconducting coil was set to 4 pF and the measurement frequency was set as 600 MHz.

Table 1 shows results of the evaluation. In Table 1, the necessary capacitance of the capacitor 6 for power feeding is shown in parenthesis and, for comparison, the case where a normal metal coil is used as the coil is also shown.

TABLE 1

Sensitivity in various coil shapes and necessary capacitance of capacitor

| connecting method | coil | 4 coil parts in parallel | two parallel pairs each constructed | 4 coil parts connected |
|---|---|---|---|---|
| direct connection | normal conductor | 104.76 (6.7 pF) | 133.09 (1.35 pF) | 148.37 (0.17 pF) |
|  | super-conductor | 366.77 (6.7 pF) | 399.75 (1.35 pF) | 428.74 (0.17 pF) |
| capacitive connection (*) | normal conductor | 112.54 (39 pF) | 127.01 (10.3 pF) | 137.93 (2.7 pF) |
|  | super-conductor | 379.19 (40 pF) | 370.95 (10.4 pF) | 374.56 (2.7 pF) |

(*)connection between coil and connection lead via capacitor of 4 pF

Although the coil shape to be employed differs according to the frequency used, it was clarified that, by connecting the superconducting coil to the normal metal lead via the capacitor to thereby form a solenoid coil, sensitivity which is higher by three times or more can be obtained. Since the capacitance of the feeding capacitor 6 can be made large, reproducibility in manufacture can be improved largely.

Example 7

A probe coil having a structure characterized by using MgB2 for the superconducting thin film and connection to the normal metal lead via the same capacitor as that in Example 1 was fabricated. In Example 7, polytetrafluoroethylene was used for a donut plate-type substrate. An $MgB_2$ thin film was formed by sputtering using a target in which B pellets are arranged on an Mg plate like in Example 1. After formation of the thin film, heat treatment was carried out at $2 \times 10^{-5}$ Torr at 400° C. for two minutes by lamp heating to crystallize the film. An AlN interlayer dielectric thin film was formed on the $MgB_2$ superconducting thin film and, after that, the Au thin film 5 serving as the overlap portion 22 and the connection piece constructing the capacitor 23 was formed. The pattern of the superconducting thin film and the pattern of the Au thin film for the capacitor and the contact are the same as those in Example 1. In this case as well, performances similar to those of Example 1 were obtained.

Example 8

To apply a radio frequency magnetic field perpendicular to the uniform magnetic field 3, it is necessary to pass a high frequency current to the probe coil. To supply the high frequency current by connection of the capacitor 23, the capacitor 23 is requested to have withstand voltage. In some cases, a single capacitor 23 in which the interlayer dielectric thin film 24 is made of $CeO_2$ shown in Example 1 is disadvantageous from the viewpoint of withstand voltage. As an example of solving the problem, an example of the capacitor 23 formed by connecting a plurality of capacitors in series is proposed.

Figure 17A:
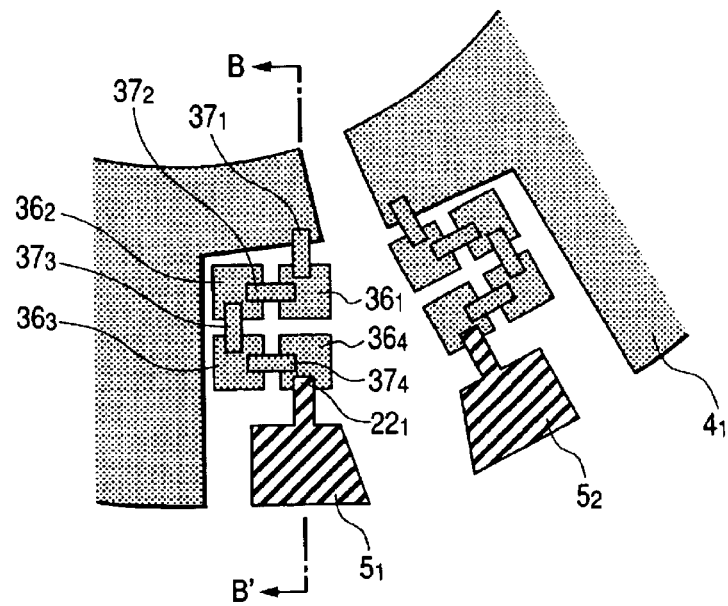
FIG. 17A is a plane figure of a slit portion in the superconducting coil part in Example 8 and an overlap portion of an Au thin film.
Figure 17B:
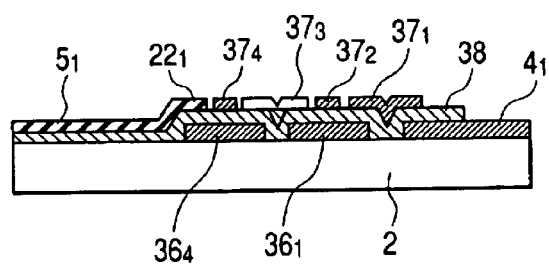
FIG. 17B is a cross section taken along line B–B' of FIG. 17A.

FIG. 17A is a plane figure of the slit portion in the superconducting coil part $4_1$ and the overlap portion 22 of the Au thin film 5 of Example 8, and FIG. 17B is a cross section taken along line B–B' of FIG. 17A. On the donut plate-type substrate 2 made of LSAT, a YBCO superconducting thin film constructing the superconducting coil having a thickness of 250 nm was formed and lower electrodes $36_1$, $36_2$, $36_3$ and $36_4$ were patterned simultaneously with patterning of the superconducting coil part $4_1$. After that, an $SrTiO_3$ interlayer dielectric thin film 38 was formed. The thickness of the $SrTiO_3$ interlayer dielectric thin film 38 was 200 nm. Subsequently, upper electrodes $37_1$, $37_2$, $37_3$, and $37_4$ patterned so as to bridge the slit in the superconducting thin film $4_1$ and the patterns of the lower electrodes $36_1$, $36_2$, $36_3$ and $36_4$ were formed. After that, the Au thin film 5 was formed and, simultaneously, the overlap portion 22 was also formed.

Figure 17C:
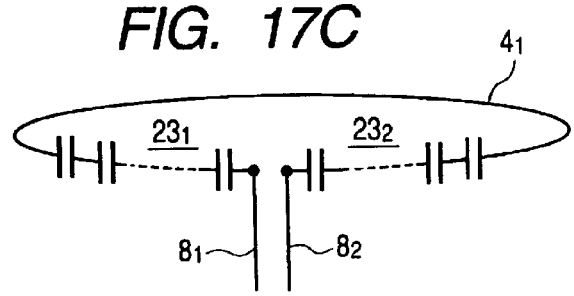
FIG. 17C is a figure illustrating connection of a superconducting coil part to a normal metal lead via a capacitor connected in series.

There are overlap portions between the slits in the superconducting coil part $4_1$ and the lower electrodes $36_1$, $36_2$, $36_3$ and $36_4$ and the upper electrodes $37_1$, $37_2$, $37_3$, and $37_4$. In the overlap portions, there is the interlayer dielectric thin film 38. The overlap portions therefore function as capacitors. In the structure shown in FIGS. 17A and 17B, nine capacitors are connected in series between the normal metal lead 8 and the Au thin film 5 of the connection portion of the superconducting coil part $4_1$. FIG. 17C is a diagram showing connection of the superconducting coil part $4_1$ to the normal metal leads $8_1$ and $8_2$ via the capacitors $23_1$ and $23_2$ connected in series.

By forming the capacitor 23 by connecting plural capacitors in series, the voltage applied to each of the capacitors becomes lower, so that the break down voltage in the case where the coil is used as a transmit coil can be increased. $SrTiO_3$ having very high relative dielectric constant is used for an interlayer dielectric thin film in order to increase the capacitance of each of the capacitors and to maintain the capacitance as a whole also when the capacitors are connected in series. Another example of the material having high relative dielectric constant is $BaTiO_3$.

According to the invention, by disposing the superconducting thin films in parallel with the magnetic field and connecting the superconducting thin films to the normal metal lead, without disturbing the magnetic field, implementation of superconductor into the probe coil can be achieved. Further, by disposing a capacitor at a connection point between the superconducting thin film and the normal metal lead, the size of the capacitor connected to the feeding point can be set to a size which can be easily controlled. As a result, an FID signal in NMR spectroscopy can be detected with high sensitivity.

What is claimed is:

1. Nuclear magnetic resonance equipment comprising:
    a superconducting magnet divided in halves for generating a predetermined uniform magnetic field; and
    a probe coil for transmitting a radio frequency signal at a predetermined resonance frequency in the direction orthogonal to the direction of said magnetic field to a sample disposed in magnetic fields of the superconducting magnet and/or for receiving a free induction decay (FID) signal,
    wherein a coil part as one of units constructing said probe coil is disposed so that a surface of a superconducting thin film formed on a donut plate-type substrate becomes parallel with said uniform magnetic field, a part in the superconducting thin film formed on said donut plate-type substrate is cut off in the radial direction, a capacitor having a stack structure of a normal metal electrode and the superconducting thin film sandwiching an insulator is formed at each of both ends of the cut part, the coil part as one of units constructing said probe coil is electrically connected to the normal metal lead via the normal metal electrode of said capacitor, and the probe coil is formed by connecting the plurality of coil parts in series, in parallel, or both in series and in parallel.

2. The nuclear magnetic resonance equipment according to claim 1, wherein in said probe coil, said normal metal lead is patterned in a microstrip line structure on the inner surface of an outer cylinder which is divided in at least two parts and is disposed so as to fasten said donut plate-type substrates from the outside.

3. The nuclear magnetic resonance equipment according to claim 1, wherein in said probe coil, the width of the superconducting thin film of the coil part as one of units constructing the coil, formed on said donut plate-type substrate lies in the range from 0.5 mm to 2 mm.

4. The nuclear magnetic resonance equipment according to claim 1, wherein in said probe coil, said normal metal electrode is formed by vapor-depositing a film of gold, silver, or an alloy of gold and silver.

5. The nuclear magnetic resonance equipment according to claim 1, wherein area of an overlap portion area of a capacitor having a stack structure of said normal metal electrode and the superconducting thin film lies in the range from 20 to 50 $\mu m^2$.

6. The nuclear magnetic resonance equipment according to claim 1, wherein the probe coil is formed by connecting three coil parts as units in parallel, connecting four coil parts in parallel, connecting four coil parts in series, or connecting two pairs of coil parts in parallel, the coil parts in each of the pairs being connected in series.

7. The nuclear magnetic resonance equipment according to claim 2, wherein in the probe coil, said normal metal lead and said normal metal electrode are electrically and mechanically connected to each other by indium adhered by ultrasound.

8. The nuclear magnetic resonance equipment according to claim 2, wherein in the probe coil, said normal metal lead is formed by an Au thin film by evaporation.

9. The nuclear magnetic resonance equipment according to claim 2, wherein in the probe coil, said normal metal lead is constructed by three stacked thin films of an Au thin film layer, an $SiO_2$ layer, and an Au thin film layer, and the Au thin film layer which is not connected to said normal metal electrode is grounded.

10. The nuclear magnetic resonance equipment according to claim 2, wherein in the probe coil, said normal metal lead is formed by stacking a thin film of copper and a thin film of aluminum.

11. The nuclear magnetic resonance equipment according to claim 2, wherein said outer cylinder is made of sapphire, grooves of the number equal to the number of coil parts as units forming the coil are formed on the inside of the outer cylinder, and the coil part as a unit is inserted in each of the grooves.

12. The nuclear magnetic resonance equipment according to claim 11, wherein in the probe coil, a section of the groove formed on the inside of the outer cylinder made of sapphire is tapered.

13. The nuclear magnetic resonance equipment according to claim 1, wherein in the probe coil, the donut plate-type superconducting thin film is made of magnesium diboride or a Y—Ba—Cu oxide superconductor.

14. The nuclear magnetic resonance equipment according to claim 1, wherein in the probe coil, the donut plate-type superconducting thin film is made of sapphire, $LaAlO_3$, LSAT, or polytetrafluoroethylene.

15. The nuclear magnetic resonance equipment according to claim 2, wherein in the probe coil, the donut plate-type superconducting thin film is made of magnesium diboride or a Y—Ba—Cu oxide superconductor.

16. The nuclear magnetic resonance equipment according to claim 12, wherein in the probe coil, the donut plate-type superconducting thin film is made of sapphire, $LaAlO_3$, LSAT, or polytetrafluoroethylene.

* * * * *